(12) United States Patent
Palanduz

(10) Patent No.: US 7,095,108 B2
(45) Date of Patent: Aug. 22, 2006

(54) ARRAY CAPACITORS IN INTERPOSERS, AND METHODS OF USING SAME

(75) Inventor: Cengiz A. Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/838,956

(22) Filed: May 5, 2004

(65) Prior Publication Data

US 2005/0248015 A1    Nov. 10, 2005

(51) Int. Cl.
*H01L 23/12* (2006.01)

(52) U.S. Cl. .................. 257/700; 257/703; 438/109; 438/125

(58) Field of Classification Search .............. 257/700, 257/703, 686, 684, 678; 438/109, 125, 106, 438/121
See application file for complete search history.

(56) References Cited

U.S. PATENT DOCUMENTS

| 6,532,143 B1 * | 3/2003 | Figueroa et al. ......... 361/301.4 |
| 2003/0193093 A1 * | 10/2003 | Brofman et al. ............ 257/779 |
| 2004/0184219 A1 * | 9/2004 | Otsuka et al. ........... 361/306.3 |

* cited by examiner

*Primary Examiner*—Douglas W Owens
(74) *Attorney, Agent, or Firm*—Schwegman, Lundberg, Woessner & Kluth, P.A.

(57) ABSTRACT

A chip package is made with the ring or dish interposer and an embedded array capacitor. A computing system is also disclosed that includes the ring or dish interposer and the embedded array capacitor.

23 Claims, 8 Drawing Sheets

US 7,095,108 B2

ARRAY CAPACITORS IN INTERPOSERS, AND METHODS OF USING SAME

TECHNICAL FIELD

Disclosed embodiments relate to an interposer structure with an array capacitor disposed within the interposer. The array capacitor is configured to include a surface that interfaces with a microelectronic device.

BACKGROUND INFORMATION

Power delivery is a significant concern in the design and operation of a microelectronic device. Where the microelectronic device is a processor or an application-specific integrated circuit (ASIC), an adequate current delivery, a steady voltage, and an acceptable processor transient response are desirable characteristics of the overall system. One of the methods for responding to a processor transient is to place a high-performance capacitor as close to the processor as possible to shorten the transient response time. Although a large-capacity and high-performance capacitor is preferable to answer the processor transients, the capacitor is in competition for space in the immediate vicinity of the processor. This may involve making a cutout in a portion of a board or socket to make room for the capacitor. A cutout in a board is a factor for increasing overall package size, which is counter to the trend to miniaturize. Another problem is placing the capacitor relatively far from the die, such that significant resistance exists in the decoupling signal path. Additionally, significant inductance is experienced in decoupling capacitors due to their conventional configuration.

The coefficient of thermal expansion (CTE) of materials proximate a die is also a problem. During the flip-chip assembly process, the solder balls (C4 bumps) are re-flowed in order to form an interconnect between the die and the substrate. The large CTE mismatch between die and substrate create detrimental stresses on the inner structure of the die.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a conductor-overlay structure that is insulated and that acts as a mounting substrate for the die. A board is usually singulated from a board array. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. The embodiment may be referred to, individually and/or collectively, herein by the term, "invention" merely for convenience and without intending to voluntarily limit the scope of this disclosure to any single invention or inventive concept if more than one is in fact disclosed. Additional structures known in the art have not been included to maintain the clarity of the drawings.

Figure 1:
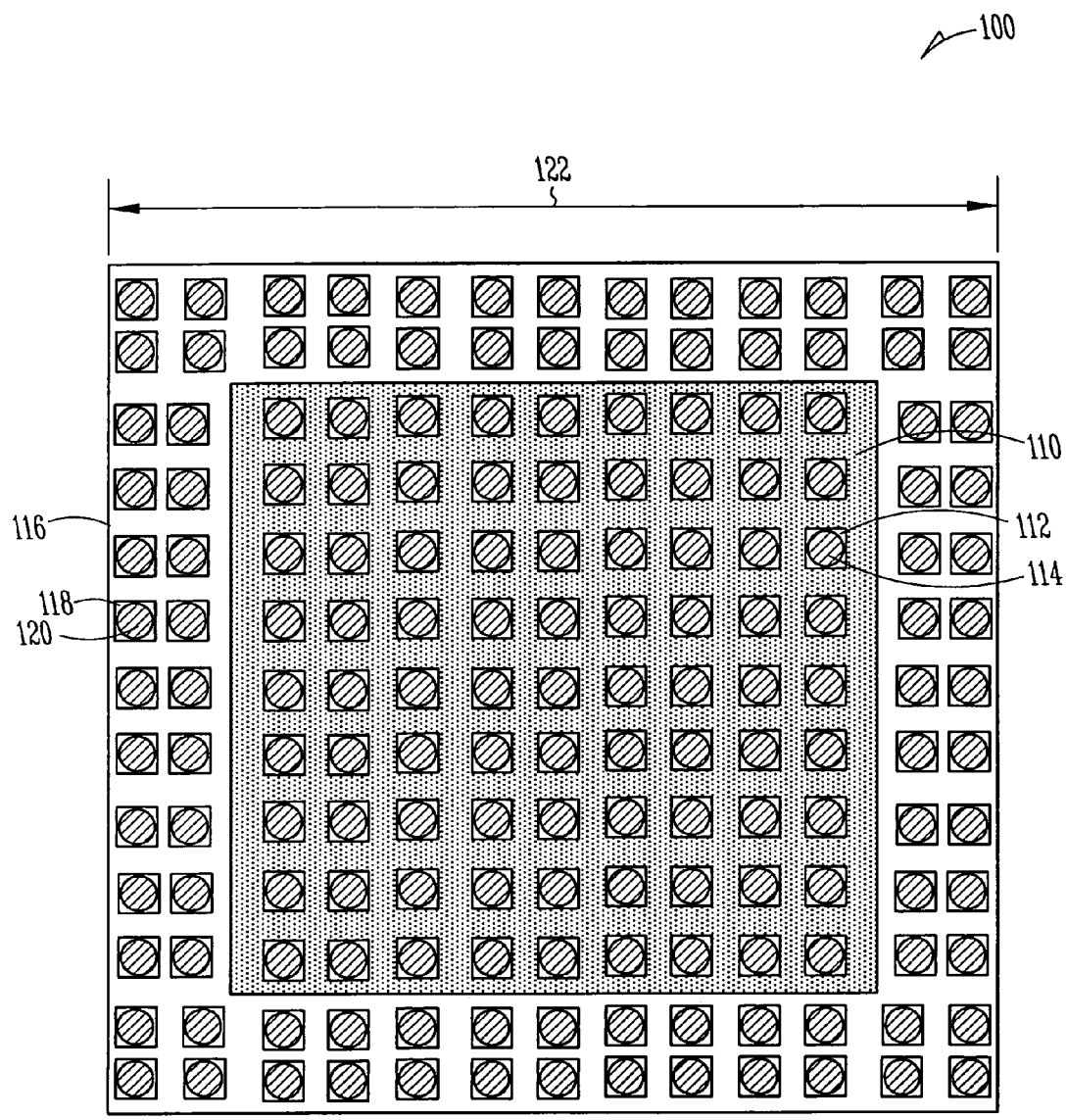
FIG. 1 is a plan of an array capacitor that is substantially encompassed by an interposer body according to an embodiment.

FIG. 1 is a plan of an array capacitor that is substantially encompassed by an interposer body according to an embodiment. An interposer package 100 includes an array capacitor 110 with a plurality of die-side capacitor bond pads 112, one of which is designated, as well as a plurality of die-side capacitor electrical bumps 114, one of which is also designated. An interposer body 116 is depicted substantially encompassing the array capacitor 110. The interposer body 116 includes a plurality of interposer bond pads 118, one of which is designated, as well as a plurality of interposer electrical bumps 120, one of which is also designated.

In an embodiment, the interposer package 100 includes chip-scale packaging dimensions. By "chip-scale packaging dimensions", it is meant that the footprint of the interposer package 100 is in a range from about 80% the largest characteristic dimension of a microelectronic die, to about 200% the largest characteristic dimension of the die. Where the interposer package 100 is substantially square, the largest characteristic dimension 122 is an edge of the interposer package 100.

Figure 7:
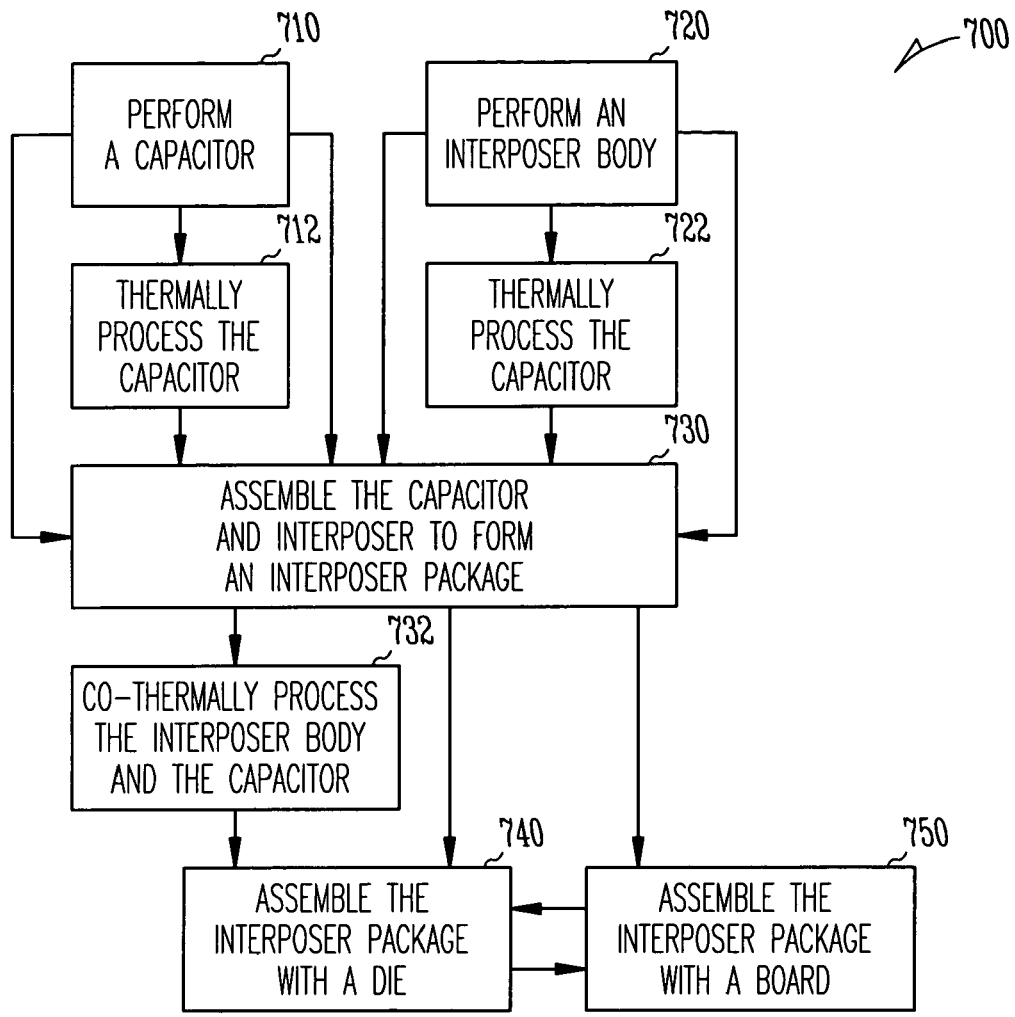
FIG. 7 is a process flow diagram according to an embodiment.

Processing of the interposer package 100 is carried out according to several embodiments. In an embodiment, the array capacitor 110 is preformed, fired, and assembled to a green ceramic interposer body 116. In an embodiment, the array capacitor 110 is tape-cast from conventional ceramic powder-based slurries. Electrical via connections are formed, and the interposer body 116 is fired. In an embodiment, the array capacitor 110 is preformed, fired, and assembled to a fired ceramic interposer body 116. In an embodiment, the array capacitor 110 is preformed, fired, and assembled to a cured polymer-containing interposer body 116. In an embodiment, the array capacitor 110 and interposer body 116 are preformed, they are assembled, and co-fired to form the interposer package 100. Other process embodiments can be carried as illustrated in FIG. 7.

Figure 2:
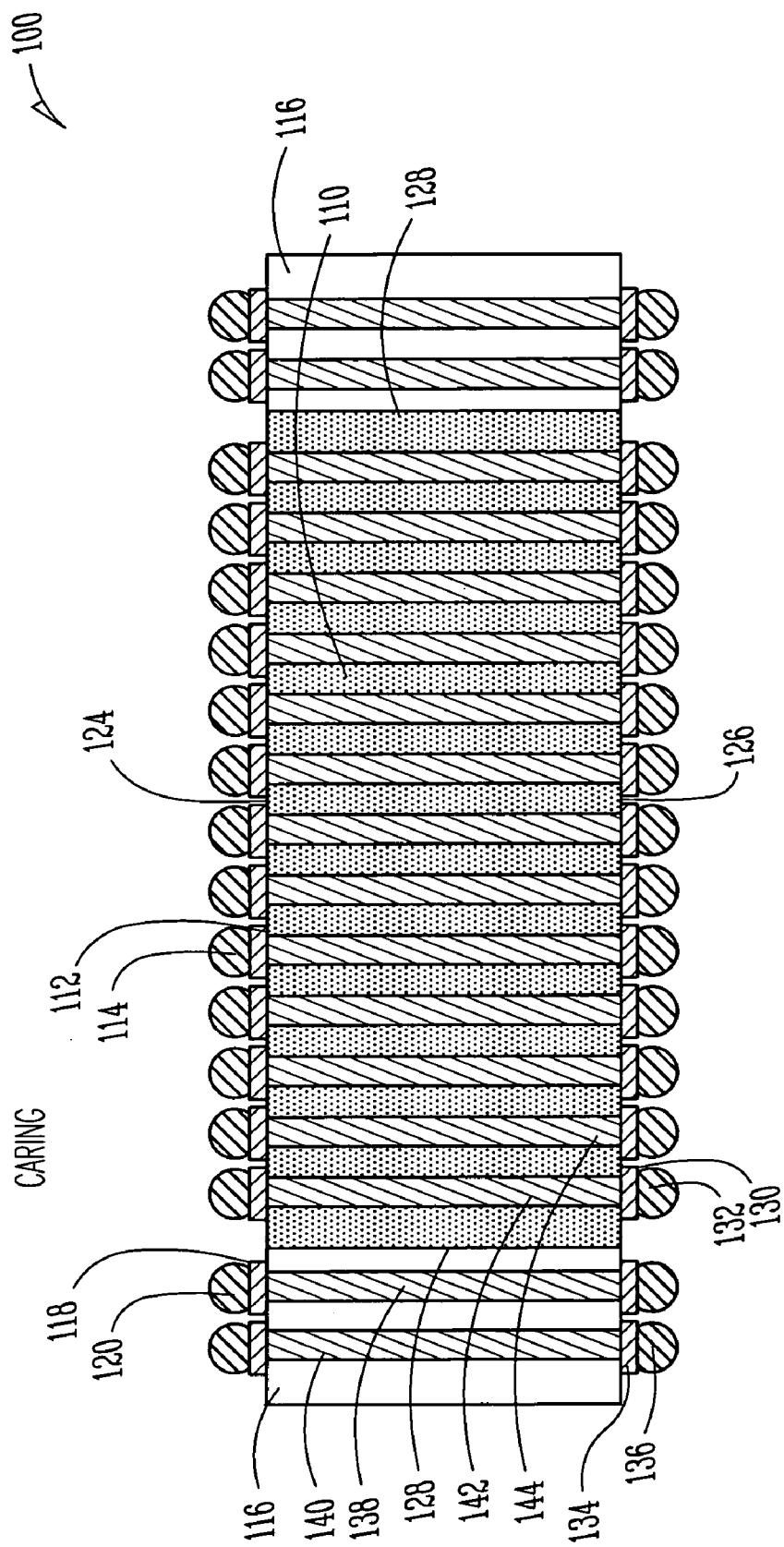
FIG. 2 is a cross section embodiment of the array capacitor and interposer body depicted in FIG. 1.

FIG. 2 is a cross section embodiment of the array capacitor 110 and interposer body 116 depicted in FIG. 1. The array capacitor 110 includes a die-side surface 124 and a board-side surface 126. The array capacitor 110 also includes at least one lateral surface 128. In an embodiment, the interposer body 116 exposes at least a portion of the die-side surface 124. In an embodiment, the interposer body 116 also exposes at least a portion of the board-side surface 126. Additionally, the board-side surface 126 of the array capacitor 110 includes a plurality of board-side array capacitor bond pads 130, one of which is designated, as well as a plurality of board-side capacitor electrical bumps 132, one of which is also designated. Similarly, the interposer body 116 includes a plurality of board-side interposer bond pads 134, one of which is designated, as well as a plurality of board-side interposer electrical bumps 136, one of which is also designated.

In an embodiment, the interposer electrical bumps 120 and 136 are used for power and signal transmission through the interposer package 100. A plurality of signal vias 138, one of which is designated, is within the interposer body 116. Similarly, a plurality of power vias 140, one of which is also designated, is disposed within the interposer body 116. In an embodiment, the signal vias 138 and the power vias 140 are disposed as depicted within the interposer body 116, but this disposition is non-limiting. The specific disposition of the signal vias 138 and the power vias 140 can be reversed, or it can be configured in an application-specific disposition.

A plurality of capacitor power vias 142, one of which is designated, is disposed within the array capacitor 110. Similarly, a plurality of capacitor ground vias 144, one of which is also designated, is disposed within the array capacitor 110. In an embodiment, the capacitor power vias 142 and the capacitor ground vias 144 are disposed as depicted within the array capacitor 110, but this disposition is non-limiting. The specific disposition the capacitor power vias 142 and the capacitor ground vias 144 can be reversed, or can be in an application-specific disposition.

In an embodiment, the capacitor electrical bumps 114 and 132 are used for decoupling capacitance functions such as a response to a load transient in a die that is coupled thereto.

Capacitor-in-Interposer Configurations

In an embodiment, the interposer package 100 includes an array capacitor 110 in a ceramic interposer ring (CARING). Because the array capacitor 110 is substantially encompassed by an interposer ring, the interposer body 116 is also referred to as a "substantial ring." In an embodiment, the interposer body 116 is a ceramic material such as low-dielectric constant (low-K) material, and the array capacitor 110 is a high-dielectric constant (high-K) material. By "low-K" and "high-K", it is understood that the dielectric constant of the material of the interposer 116 is lower than the dielectric constant of the material of the array capacitor 110.

In an embodiment, the CARING interposer package 100 includes a low-temperature co-fired ceramic (LTCC) with a CTE in a range from about 3 ppm/° C. to about 7 ppm/° C.

In an embodiment, the CARING interposer package 100 includes a high-temperature co-fired ceramic (HTCC) with a CTE in a range from about 5 ppm/° C. to about 7 ppm/° C.

In an embodiment, the footprint (e.g., the square of the largest characteristic dimension 122) of the array capacitor is about 5×5 millimeter (mm) and has a capacitance of about 0.7 $\mu F/cm^2$, but the area taken by the vias 142 and 144 reduces the area by about 50%. Consequently, the capacitance of a 23-layer array capacitor 110 is about 2 $\mu F$. In an embodiment, the capacitance of a 46-layer array capacitor 110 is about 4 $\mu F$. In an embodiment, the capacitance of a 69-layer array capacitor 110 is about 6 $\mu F$. Other footprints and capacitances can be achieved according to specific application embodiments.

In an embodiment, the material of the array capacitor 110 is barium titanate, $BaTiO_3$, and has a CTE of about 9 ppm/° C. Accordingly, where a die has a CTE of about 3.5 ppm/° C. and where a mounting substrate of resin-impregnated fiberglass has a CTE of about 17 ppm/° C., the CTEs of the array capacitor 110 and the interposer body 116 are juxtaposed therebetween.

Figure 3:
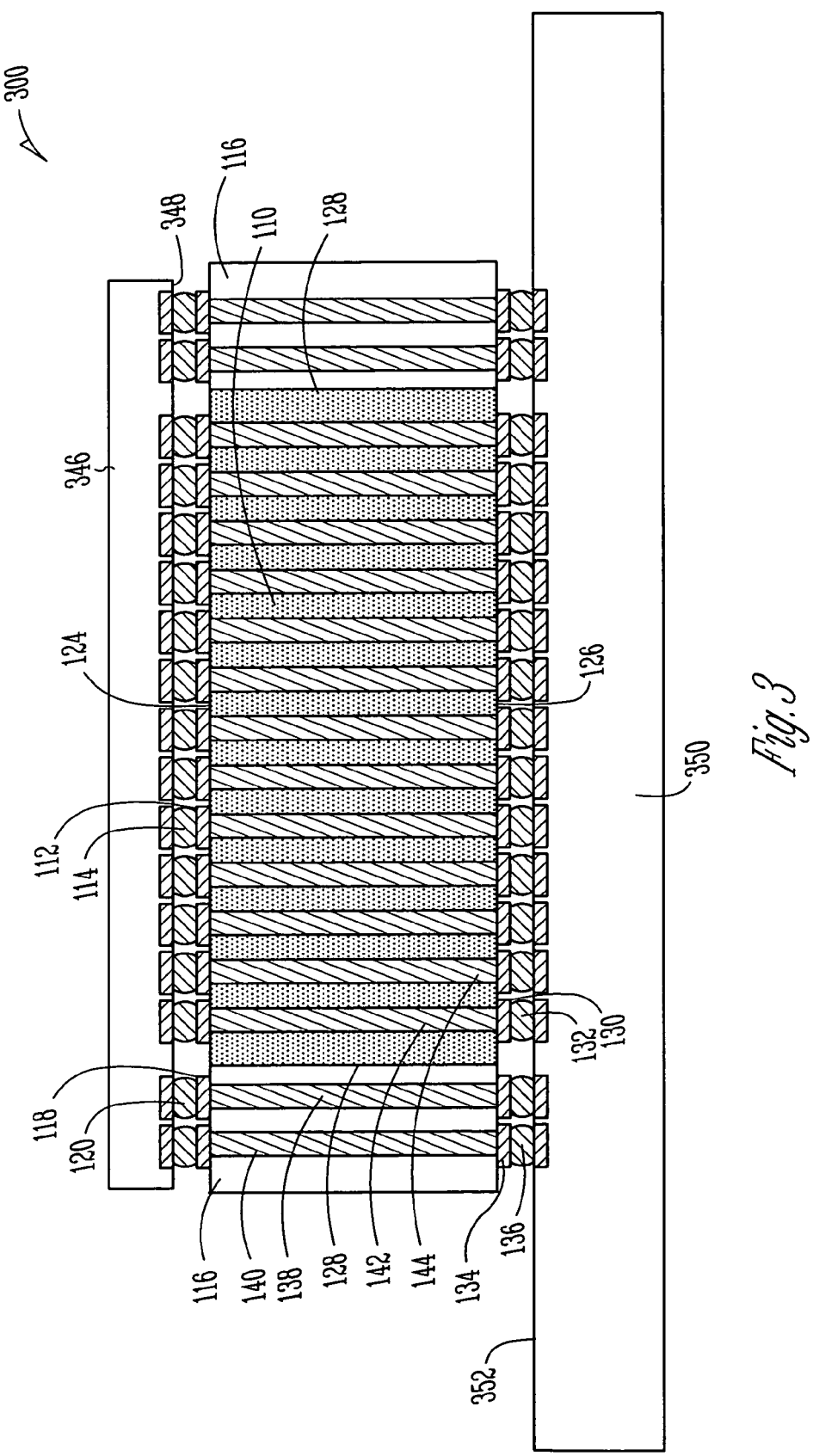
FIG. 3 is a cross section embodiment of the array capacitor and interposer body depicted in FIG. 2 after further processing as part of a package.

FIG. 3 is a cross section embodiment of the array capacitor 110 and interposer body 116 depicted in FIG. 2 after further processing as part of a package 300. The package 300 includes the array capacitor 110, the interposer body 116, and their respective electrical connections as depicted in FIGS. 1 and 2.

In an embodiment, a die 346 includes an active surface 348. The die 346 is disposed upon the interposer package 100 with the die-side surface 124 of the array capacitor 110 electrically coupled directly to the active surface 348 of the die 346. In other words, the die-side surface 124 is in contact with the active surface 348 by the medium of at least the electrical bump 120. In an embodiment, a mounting substrate 350 is disposed below the interposer package 100 with the board-side surface 126 directly electrically coupled to an upper surface 352 of the mounting substrate 350. Because the array capacitor 110 is disposed directly in the interposer package 100, direct current (DC) resistance is decreased due to the substantial elimination of lateral current flow during a decoupling capacitor event.

In an embodiment, the mounting substrate 350 is part of a printed wiring board (PWB) such as a main board. In an embodiment, the mounting substrate 350 is part of a mezzanine PWB. In an embodiment, the mounting substrate 350 is part of an expansion card PWB. In an embodiment, the mounting substrate 350 is part of a small PWB such as a board for a handheld device such as a cell phone or a personal digital assistant (PDA).

Reference is again made to FIG. 3. In an embodiment, the interposer package 100 includes an array capacitor 110 in an organic ring (CORING). Because the array capacitor 110 is substantially encompassed by an interposer ring, the interposer body 116 is also referred to as a "substantial ring." In an embodiment, the CORING interposer package 100 includes an organic composition for the interposer body 116, such as a polymer that is suited to interposer structures. In an embodiment, the interposer body 116 includes a CTE in a range from about 14 ppm/° C. to about 40 ppm/° C. In an embodiment, the interposer body 116 includes a CTE of about 17 ppm/° C.

Various materials are used as the polymers for the interposer body 116, including resins according to an embodiment. In an embodiment, an epoxy is used. In an embodiment, a cyanate ester composition or the like is used. In an embodiment, a polyimide composition or the like is used. In an embodiment, a polybenzoxazole composition or the like is used. In an embodiment, a polybenzimidazole composition or the like is used. In an embodiment, a polybenzoxazole composition or the like is used. In an embodiment, a polybenzothiazole composition or the like is used. In an embodiment, a combination of any two of the compositions is used. In an embodiment, a combination of any three of the compositions is used. In an embodiment, a combination of any four of the compositions is used. In an embodiment, a combination of any five of the compositions is used. In an embodiment, a combination of any six of the compositions is used.

In an embodiment, a polybenzoxazole is used by casting it with the vias 138 and 140 in place, and by curing. In an embodiment, curing includes thermal curing the polymer(s). In an embodiment, curing includes cross-link curing the polymer(s).

In an embodiment, curing includes cyclization curing the polymer(s). In an embodiment, curing includes at least two of the above curing operations.

In an embodiment, a prepolymer is in non-cyclized form before it is further processed, such as by heating to a temperature over its glass transition temperature ($T_G$). Upon heating, the prepolymer begins to cyclize and thereby cure, by reacting with functional groups nearby, and in the process by releasing water molecules. This cyclization changes the prepolymer from its non-cyclized state to its cyclized state, and to different properties that are exhibited between the two states.

In an embodiment, a polybenzoxazole prepolymer is synthesized by reacting di hydroxylamines with di acids, to form a hydroxyl amide. The hydroxy amide is heated by infrared (IR) or by microwaves. The heating process begins to convert the prepolymer to a closed-ring polybenzoxazole.

In an embodiment, the CTE of the interposer body 116 is about 30 part per million (ppm)/° C. In an embodiment, the thermal stability of the interposer body 116 exceeds about 450° C. Generally, the polymer is substantially chemically inert and substantially insoluble after thermal processing. In an embodiment the polymer has a dielectric constant of about 2.5. After thermal processing the closed-ring polybenzoxazole has greater adhesion to metal substrates such as copper or aluminum, which can be the material of the vias 138 and 140.

In an embodiment, a poly (o-hydroxyamide) precursor is dissolved and cast as an uncured interposer body 116. The uncured interposer body polymer 116 is in a non-cyclized state. The $T_G$ of the hydroxyamide is also about 75 to 100° C. lower than the cured polymer. The hydroxyamide is next cured to a temperature of about 75 to 100° C. higher than the uncured $T_G$. Curing allows the interposer body to retain permanent features. During thermal processing with either IR or microwave energy, conversion of uncured polymer from a poly(hydroxyamide) to a fully cyclized poly benzoxazole film occurs. The $T_G$ shifts upwardly to about 75 to 100° C. higher than the uncured polymer.

Figure 4:
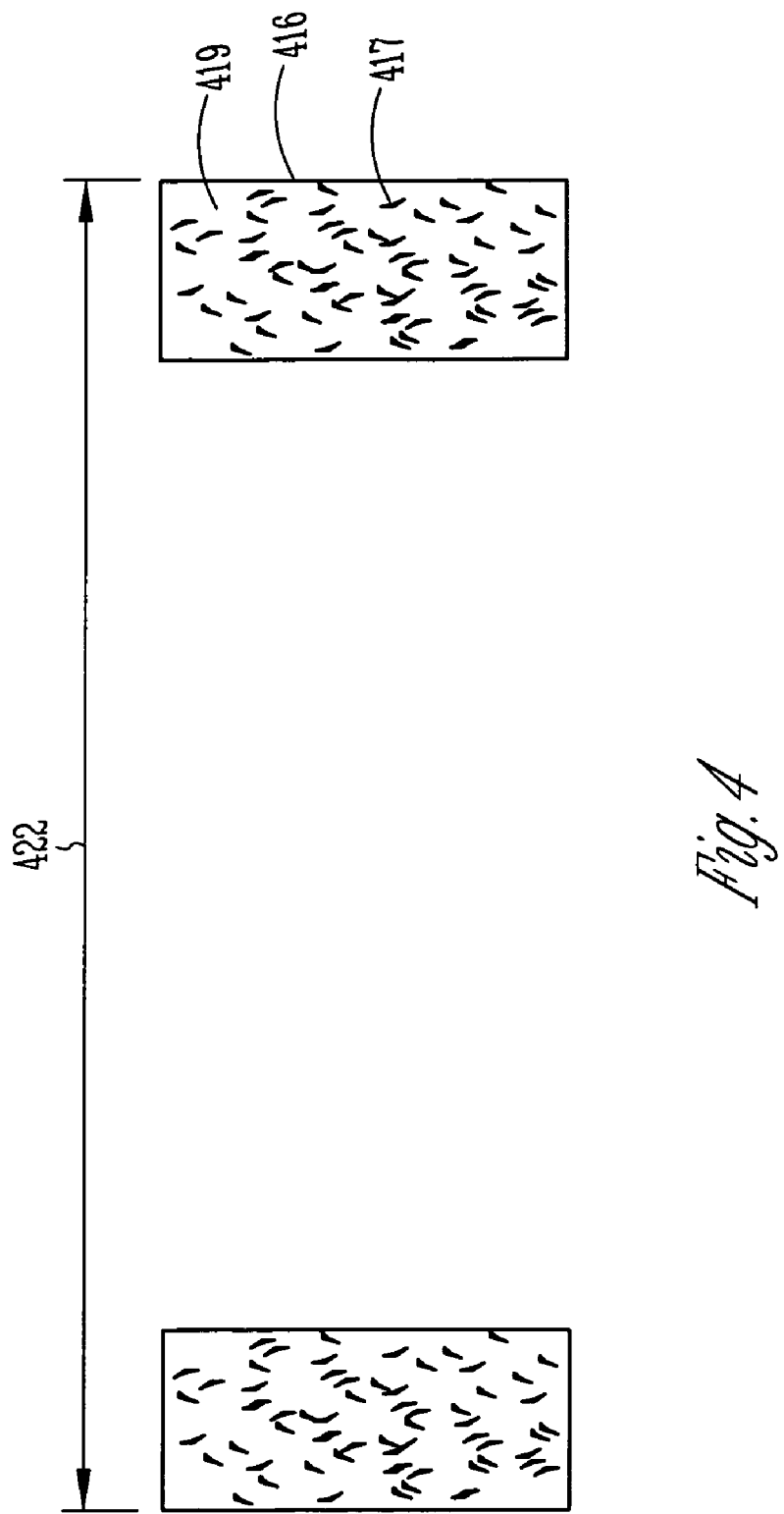
FIG. 4 is a cross section detail of a portion of an interposer body that includes an inorganic particulate disposed in an organic matrix according to an embodiment.

FIG. 4 is a cross section detail of a portion of an interposer body 416 that includes an inorganic particulate 417 disposed in an organic matrix 419 (PIM) according to an embodiment. The largest characteristic dimension 422 is depicted for reference.

In an embodiment, the organic matrix 419 acts as a matrix for a filler material 417 that is included for thermal management. In an embodiment, the filler material 417 is a particulate such as silica or the like. In an embodiment, the filler material 417 is a particulate such as ceria or the like. In an embodiment, the filler material 417 is a particulate such as zirconia or the like. In an embodiment, the filler material 417 is a particulate such as thoria or the like. Other particulates may be used. In an embodiment, the filler material 417 is present in a range from about 1 percent to about one-half or greater the total weight of the interposer body 416. In an embodiment, the filler material 417 is in a range from about 2 percent to about 30 percent. In an embodiment, the filler material 417 is in a range from about 5 percent to about 25 percent. In an embodiment, the filler material 417 is in a range from about 10 percent to about 20 percent.

In an embodiment, the PIM interposer body 416 includes a composite CTE in a range from about 9 ppm/° C. to about 16 ppm/° C. The specific CTE can be selected within this range, or outside this range according to an application, and can be selected to balance between interposer body cohesion and to provide a stress-relieving interposer body 416 that includes a CTE between the CTE of a given mounting substrate and the CTE of a given die.

Figure 5:
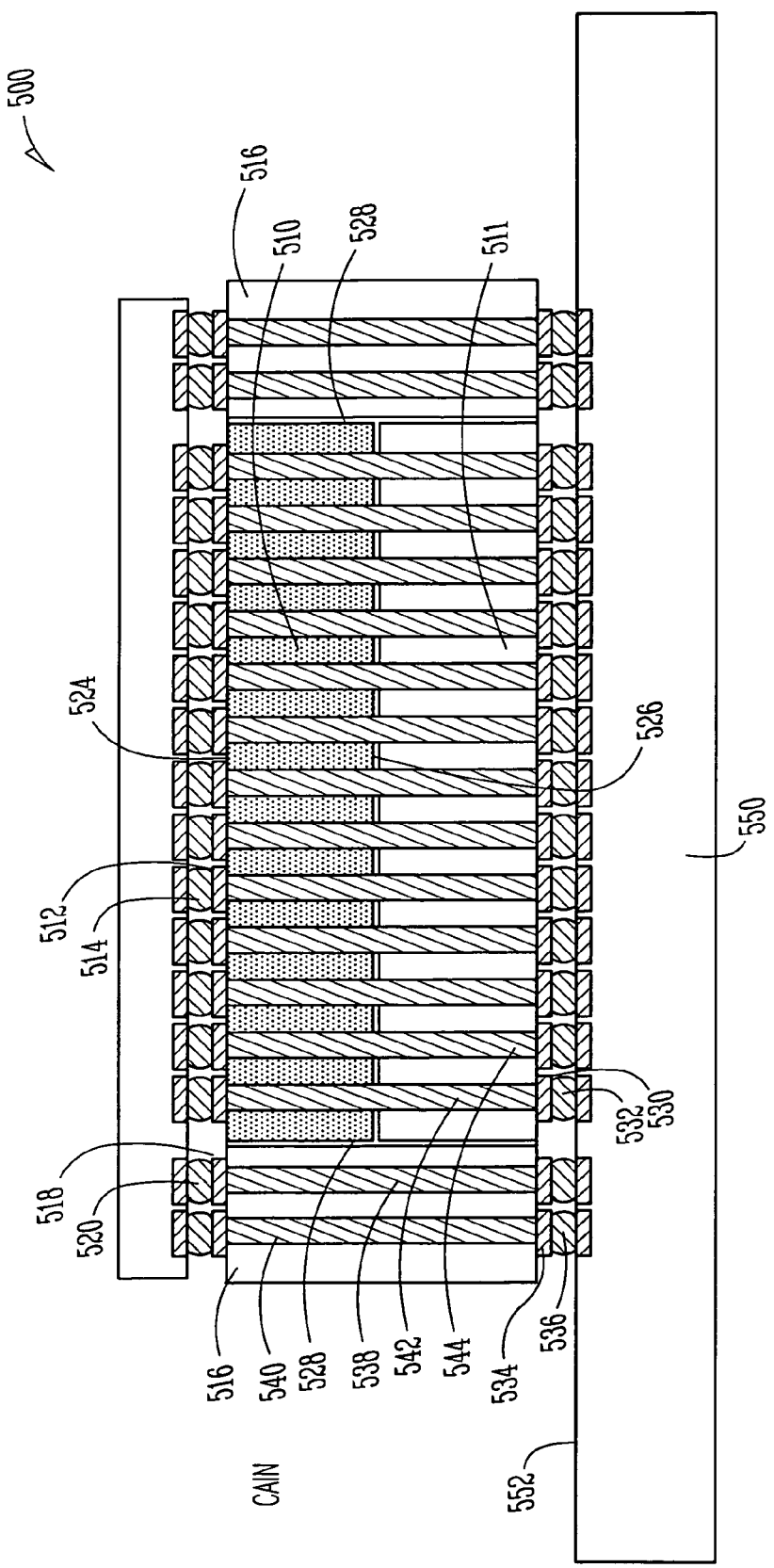
FIG. 5 is a cross section embodiment of an array capacitor and interposer body as part of an interposer package according to an embodiment.

FIG. 5 is a cross section of an array capacitor 510 and interposer body 516 as part of an interposer package 500 according to an embodiment. The array capacitor 510 includes a die-side surface 524 and a board-side surface 526. The array capacitor 510 also includes at least one lateral surface 528. In an embodiment, the interposer body 516 exposes at least a portion of the die-side surface 524. In an embodiment, the interposer body 516 also houses an interposer spacer 511 that abuts at least a portion of the board-side surface 526 of the array capacitor 510. Electrical communication through the array capacitor 510 includes a plurality of vias 542, 544 that are pinned out against the interposer spacer 511 as it abuts a mounting substrate 550 at its upper surface 552. Similarly, the interposer body 516 includes a plurality of board-side interposer bond pads 534, one of which is designated, as well as a plurality of board-side interposer electrical bumps 536, one of which is also designated. Because the array capacitor 510 is substantially encompassed by an interposer ring, the interposer body 516 is also referred to as a "substantial ring."

In an embodiment, the interposer electrical bumps 520 and 536 are used for power and signal transmission through the interposer package 500. A plurality of signal vias 538, one of which is designated, is within the interposer body 516. Similarly, a plurality of power vias 540, one of which is also designated, is disposed within the interposer body 516. In an embodiment, the signal vias 538 and the power vias 540 are disposed as depicted within the interposer body 516, but this disposition is non-limiting. The specific disposition of the signal vias 538 and the power vias 540 can be reversed, or can it be in an application-specific disposition.

A plurality of capacitor power vias 542, one of which is designated, is disposed within the array capacitor 510. Similarly, a plurality of capacitor ground vias 544, one of which is designated, is disposed within the array capacitor 510. In an embodiment, the capacitor power vias 542 and the capacitor ground vias 544 are disposed as depicted within the array capacitor 510, but this disposition is non-limiting. The specific disposition of the capacitor power vias 542 and the capacitor ground vias 544 can be reversed, or can be in an application-specific disposition.

In an embodiment, the capacitor electrical bumps 514 and 532 are used for decoupling capacitance functions such as a response to a load transient in a die that is coupled thereto.

In an embodiment, the interposer body 516 is a ceramic according to any of the embodiments set forth in this disclosure, and the interposer insert 511 is also a ceramic according to any of the embodiments set forth in this disclosure. In an embodiment, the interposer body 516 is a ceramic according to any of the embodiments set forth in this disclosure, and the interposer insert 511 is an organic such as a polymer according to any of the embodiments set forth in this disclosure. In an embodiment, the interposer body 516 is a ceramic according to any of the embodiments set forth in this disclosure, and the interposer insert 511 is also an organic-inorganic composite according to any of the embodiments set forth in this disclosure. In an embodiment, the interposer body 516 is an organic according to any of the embodiments set forth in this disclosure, and the interposer insert 511 is a ceramic according to any of the embodiments set forth in this disclosure. In an embodiment, the interposer body 516 is an organic according to any of the embodiments set forth in this disclosure, and the interposer insert 511 is also an organic such as a polymer according to any of the embodiments set forth in this disclosure. In an embodiment, the interposer body 516 is an organic according to any of the embodiments set forth in this disclosure, and the interposer insert 511 is an organic-inorganic composite according to any of the embodiments set forth in this disclosure. In an embodiment, the interposer body 516 is an organic-inorganic composite according to any of the embodiments set forth in this disclosure, and the interposer insert 511 is a ceramic according to any of the embodiments set forth in this disclosure. In an embodiment, the interposer body 516 is an organic-inorganic composite according to any of the embodiments set forth in this disclosure, and the interposer insert 511 is an organic such as a polymer according to any of the embodiments set forth in this disclosure. In an embodiment, the interposer body 516 is an organic-inorganic composite according to any of the embodiments set forth in this disclosure, and the interposer insert 511 is also an organic-inorganic composite according to any of the embodiments set forth in this disclosure.

Figure 6:
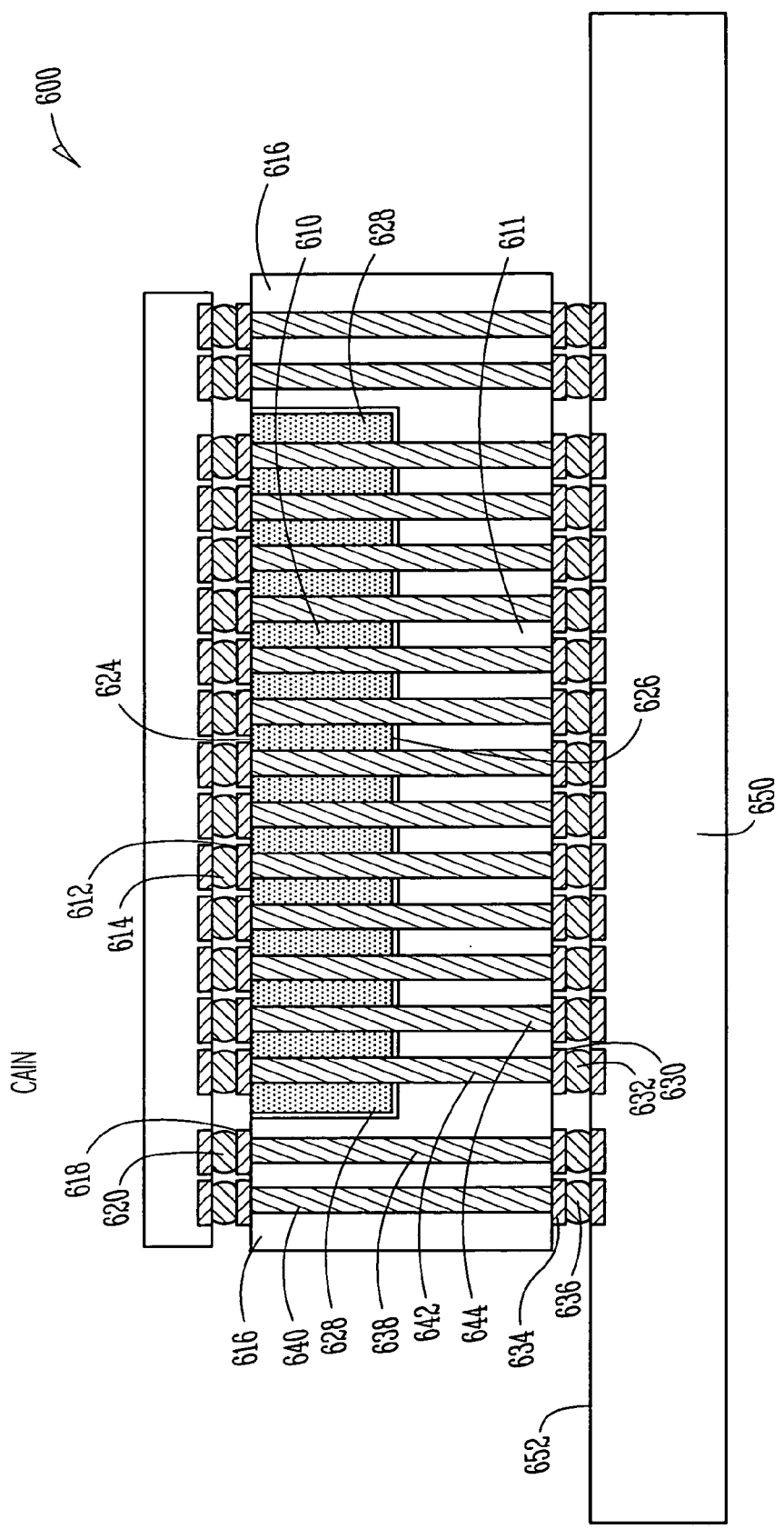
FIG. 6 is a cross section embodiment of an array capacitor and dished interposer body as part of an interposer package according to an embodiment.

FIG. 6 is a cross section of an array capacitor 610 and interposer body 616 as part of an interposer package 600 according to an embodiment. The array capacitor 610 includes a die-side surface 624 and a board-side surface 626. The array capacitor 610 also includes at least one lateral surface 628. In an embodiment, the interposer body 616 exposes at least a portion of the die-side surface 624. In an embodiment, the interposer body 616 also includes an interposer recess 611 with a floor 611 that abuts at least a portion of the board-side surface 626 of the array capacitor 610. The recess 611 is a feature that allows the interposer body 616 to be a dish interposer 616. Electrical communication through the array capacitor 610 includes a plurality of vias 642, 644 that are pinned out against the interposer recess 611 and as the vias 642, 644 abut a mounting substrate 650 at its upper surface 652. Similarly, the interposer body 616 includes a plurality of board-side interposer bond pads 634, one of which is designated, as well as a plurality of board-side interposer electrical bumps 636, one of which is also designated. Because the array capacitor 610 is substantially encompassed by an interposer ring, the interposer body 616 is also referred to as a "substantial ring."

In an embodiment, the interposer electrical bumps 620 and 636 are used for power and signal transmission through the interposer package 600. A plurality of signal vias 638, one of which is designated, is within the interposer body 616. Similarly, a plurality of power vias 640, one of which is also designated, is disposed within the interposer body 616. In an embodiment, the signal vias 638 and the power vias 640 are disposed as depicted within the interposer body 616, but this disposition is non-limiting. The specific disposition of the signal vias 638 and the power vias 640 can be reversed, or can be in an application-specific disposition.

A plurality of capacitor power vias 642, one of which is designated, is disposed within the array capacitor 610. Similarly, a plurality of capacitor ground vias 644, one of which is designated, is disposed within the array capacitor 610. In an embodiment, the capacitor power vias 642 and the capacitor ground vias 644 are disposed as depicted within the array capacitor 610, but this disposition is non-limiting. The specific disposition of the capacitor power vias 642 and the capacitor ground vias 644 can be reversed, or can be in an application-specific disposition.

In an embodiment, the capacitor electrical bumps 614 and 632 are used for decoupling capacitance functions such as a response to a load transient in a die that is coupled thereto.

In an embodiment, the interposer body 616 is a ceramic according to any of the embodiments set forth in this disclosure. In an embodiment, the interposer body 616 is an organic according to any of the embodiments set forth in this disclosure. In an embodiment, the interposer body 616 is an organic-inorganic composite according to any of the embodiments set forth in this disclosure.

FIG. 7 is a process flow diagram 700 according to an embodiment. At 710, the process includes preforming an array capacitor. For example, a green-ceramic capacitor is formed of $BaTiO_3$ and prepared for further processing. At 712, the process includes thermally processing the green-ceramic capacitor. Such processing is conventional such as firing. Vias are placed according to conventional processing.

At 720, the process includes preforming an interposer body. In an embodiment, a green-ceramic interposer body is formed and prepared for further processing. In an embodiment, a polymer-containing interposer body is preformed. At 712, the process includes thermally processing the interposer body. In an embodiment, thermally processing includes thermally curing a polymer. In an embodiment, thermally processing includes firing a ceramic. Such processing is conventional. Vias are placed according to conventional processing.

At 730, a separate process can commence by assembling the capacitor and the interposer body, in their various degrees of finishing as set forth above. The process of assembling the capacitor and the interposer body results in an interposer package. At 732, a process embodiment includes co-firing the capacitor preform and the interposer body preform to form an interposer package. Electrical bumps are formed according to conventional processing such as by screen printing and reflowing.

At 740, the interposer package is assembled with a die, followed by assembling the die and interposer package with a mounting substrate.

Similarly at 750, the interposer package is assembled with a mounting substrate, followed by assembling the mounting substrate and interposer package a die.

In an embodiment, assembly of the interposer package is achieved substantially simultaneously with a mounting substrate and a die.

Figure 8:
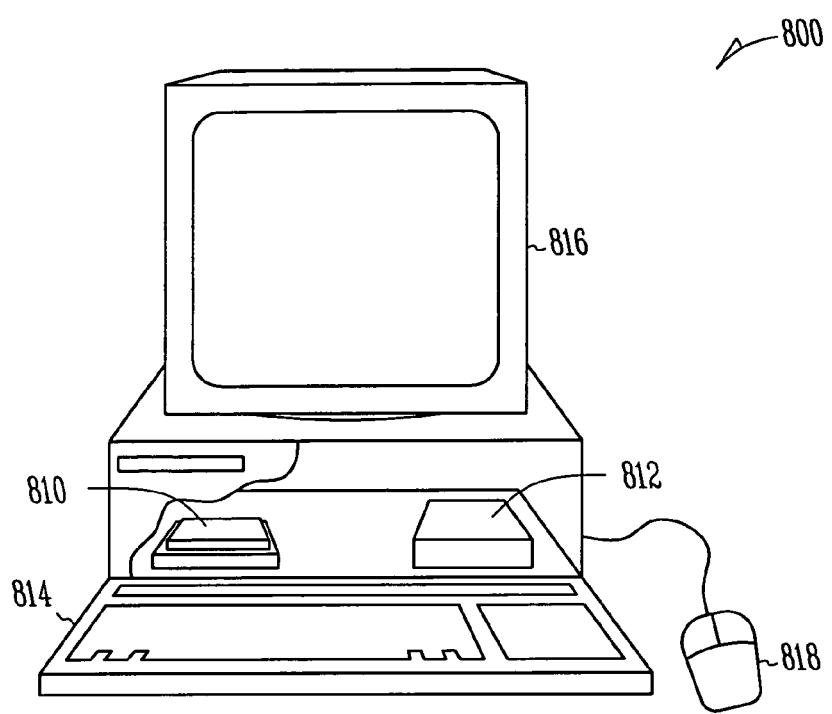
FIG. 8 is a depiction of a computing system according to an embodiment.

FIG. 8 is a depiction of a computing system 800 according to an embodiment. The computing system 800 includes array capacitor-in-interposer configuration according to an embodiment. One or more of the foregoing embodiments of the array capacitor-in-interposer configuration may be utilized in a computing system, such as a computing system 800 of FIG. 8. The computing system 800 includes at least one processor (not pictured), which is enclosed in a package 810, a data storage system 812, at least one input device such as keyboard 814, and at least one output device such as monitor 816, for example. The computing system 800 includes a processor that processes data signals, and may include, for example, a microprocessor, available from Intel Corporation. In addition to the keyboard 814, the computing system 800 can include another user input device such as a mouse 818, for example.

For purposes of this disclosure, a computing system 800 embodying components in accordance with the claimed subject matter may include any system that utilizes a microelectronic device system, which may include, for example, an array capacitor-in-interposer configuration that is coupled to data storage such as dynamic random access memory (DRAM), polymer memory, flash memory, and phase-change memory. In this embodiment, the array capacitor-in-interposer configuration is coupled to any combination of these functionalities by being coupled to a processor. In an embodiment, however, an array capacitor-in-interposer configuration set forth in this disclosure is coupled to any of these functionalities. For an example embodiment, data storage includes an embedded DRAM cache on a die. Additionally in an embodiment, the array capacitor-in-interposer configuration that is coupled to the processor (not pictured) is part of the system with an array capacitor-in-interposer configuration that is coupled to the data storage of the DRAM cache. Additionally in an embodiment, an array capacitor-in-interposer configuration is coupled to the data storage 812.

In an embodiment, the computing system can also include a die that contains a digital signal processor (DSP), a micro controller, an application specific integrated circuit (ASIC), or a microprocessor. In this embodiment, the array capacitor-in-interposer configuration is coupled to any combination of these functionalities by being coupled to a processor. For an example embodiment, a DSP (not pictured) is part of a chipset that may include a stand-alone processor (in package 810) and the DSP as separate parts of the chipset. In this embodiment, an array capacitor-in-interposer configuration is coupled to the DSP, and a separate array capacitor-in-interposer configuration may be present that is coupled to the processor in package 810. Additionally in an embodiment, an array capacitor-in-interposer configuration is coupled to a DSP that is mounted on the same board as the package 810.

It can now be appreciated that embodiments set forth in this disclosure can be applied to devices and apparatuses other than a traditional computer. For example, a die can be packaged with an embodiment of the array capacitor-in-interposer configuration, and placed in a portable device such as a wireless communicator or a hand-held device such as a personal data assistant and the like. Another example is a die that can be packaged with an embodiment of the array capacitor-in-interposer configuration and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An interposer comprising:
   an array capacitor including a die-side surface, a board-side surface and a lateral surface; and
   an interposer body, wherein the interposer body exposes at least part of the die-side surface, and wherein the interposer body substantially encompasses the lateral surface.

2. The interposer of claim 1, wherein the interposer body exposes at least part of the board-side surface.

3. The interposer of claim 1, wherein the interposer body exposes at least part of the board-side surface, and wherein the interposer body includes a ceramic material.

4. The interposer of claim 1, wherein the interposer body exposes at least part of the board-side surface, and wherein the interposer body includes an organic material.

5. The interposer of claim 1, wherein the interposer body exposes at least part of the board-side surface, and wherein the interposer body includes an organic material and a dielectric particulate.

6. The interposer of claim 1, wherein the interposer body includes a recess and a floor, and wherein the capacitor board-side surface is coupled to the floor.

7. The interposer of claim 1, wherein the interposer body includes a recess and a floor, wherein the capacitor board-side surface is coupled to the floor, and wherein the interposer body includes a ceramic material.

8. The interposer of claim 1, wherein the interposer body includes a recess and a floor, wherein the capacitor board-side surface is coupled to the floor, and wherein the interposer body includes an organic material.

9. The interposer of claim 1, further including:
   an interposer spacer, and wherein the capacitor board-side surface is coupled to the interposer spacer.

10. The interposer of claim 1, further including:
    an interposer spacer, and wherein the capacitor board-side surface is coupled to the interposer spacer, and wherein the interposer body includes a ceramic material.

11. The interposer of claim 1, further including:
    an interposer spacer, and wherein the capacitor board-side surface is coupled to the interposer spacer, and wherein the interposer body includes an organic material.

12. A package comprising:
    a microelectronic die;
    an interposer disposed beneath the microelectronic die, the interposer including:
      an array capacitor including a die-side surface, a board-side surface and a lateral surface; and
      an interposer body, wherein the interposer body exposes at least part of the die-side surface, wherein the interposer body substantially encompasses the lateral surface; and
    a mounting substrate disposed beneath the interposer.

13. The package of claim 12, wherein the interposer body includes a material selected from a ceramic, a polymer, a polymer-inorganic particulate compound, and combinations thereof.

14. The package of claim 12, wherein the die-side surface is coupled with the die through an electrical bump.

15. A process comprising:
   placing an array capacitor within an interposer body, wherein the array capacitor includes a die-side surface, a board-side surface and a lateral surface, wherein the interposer body exposes at least part of the die-side surface, and wherein the interposer body substantially encompasses the lateral surface.

16. The process of claim 15, before placing the array capacitor, further including:
   casting the interposer body from a green ceramic source; and
   casting the capacitor from a green capacitor source.

17. The process of claim 15, further including:
   casting the interposer body from a green ceramic source;
   casting the capacitor from a green capacitor source; and
   co-firing the interposer body with the capacitor.

18. The process of claim 15, before placing the capacitor, further including:
   casting the interposer body from a green ceramic source;
   firing the interposer body;
   casting the capacitor from a green capacitor source; and
   firing the capacitor.

19. The process of claim 15, further including:
   forming the interposer body including curing a polymer.

20. The process of claim 15, before placing the capacitor, further including:
   forming the interposer body including curing a polymer;
   casting the capacitor from a green capacitor source; and
   firing the capacitor.

21. A computing system comprising:
   a microelectronic die;
   an interposer disposed beneath the microelectronic die, the interposer including:
      an array capacitor including a die-side surface, a board-side surface and a lateral surface; and
      an interposer body, wherein the interposer body exposes at least part of the die-side surface, wherein the interposer body substantially encompasses the lateral surface; and
   at least one of an input device and an output device.

22. The computing system of claim 21, wherein the computing system is disposed in one of a computer, a wireless communicator, a hand-held device, an automobile, a locomotive, an aircraft, a watercraft, and a spacecraft.

23. The computing system of claim 21, wherein the die is selected from a data storage device, a digital signal processor, a micro controller, an application specific integrated circuit, and a microprocessor.

* * * * *